US006988537B2

(12) United States Patent
Hata et al.

(10) Patent No.: US 6,988,537 B2
(45) Date of Patent: Jan. 24, 2006

(54) COOLING UNIT HAVING A PLURALITY OF HEAT-RADIATING FINS, AND ELECTRONIC APPARATUS WITH THE COOLING UNIT

(75) Inventors: Yukihiko Hata, Hamura (JP); Kentaro Tomioka, Sayama (JP); Mitsuyoshi Tanimoto, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/853,016

(22) Filed: May 25, 2004

(65) Prior Publication Data

US 2005/0006062 A1 Jan. 13, 2005

(30) Foreign Application Priority Data

May 26, 2003 (JP) .............................. 2003-147806

(51) Int. Cl.
*F28D 15/00* (2006.01)
(52) U.S. Cl. ........................... 165/104.33; 165/104.21; 165/80.4; 361/687; 361/699; 257/714; 174/15.1
(58) Field of Classification Search ............... 165/80.3, 165/185, 104.26, 104.21, 104.33; 361/699, 361/700; 174/15.2; 257/714–716
See application file for complete search history.

(56) References Cited

U.S. PATENT DOCUMENTS

| 5,646,824 | A | * | 7/1997 | Ohashi et al. .............. 361/699 |
| 6,029,742 | A | * | 2/2000 | Burward-Hoy ............. 165/80.4 |
| 6,152,214 | A | * | 11/2000 | Wagner ....................... 165/121 |
| 6,311,767 | B1 | * | 11/2001 | Inoue et al. ................ 165/80.4 |
| 6,328,097 | B1 | * | 12/2001 | Bookhardt et al. ..... 165/104.33 |
| 6,439,299 | B1 | * | 8/2002 | Miyahara et al. ........... 165/121 |
| 6,487,076 | B1 | * | 11/2002 | Wang ......................... 361/697 |
| 6,510,052 | B2 | | 1/2003 | Ishikawa et al. |
| 6,752,201 | B2 | * | 6/2004 | Cipolla et al. .............. 165/121 |
| 6,832,646 | B1 | * | 12/2004 | Uomori et al. ............ 165/80.2 |
| 2003/0053296 | A1 | * | 3/2003 | Tanaka et al. .............. 361/719 |
| 2003/0161102 | A1 | * | 8/2003 | Lee et al. .................... 361/687 |

* cited by examiner

*Primary Examiner*—Terrell McKinnon
(74) *Attorney, Agent, or Firm*—Foley & Lardner LLP

(57) ABSTRACT

A cooling unit including a fan, a plurality of heat-radiating fins and a tube. Liquid coolant that has absorbed heat from a heat-radiating component is made to circulate in the tube. The fan has an impeller. The draws cooling air at its center part and expels the cooling air at its periphery. The heat-radiating fins oppose the periphery of the impeller. The tube is thermally connected to the heat-radiating fins.

12 Claims, 11 Drawing Sheets

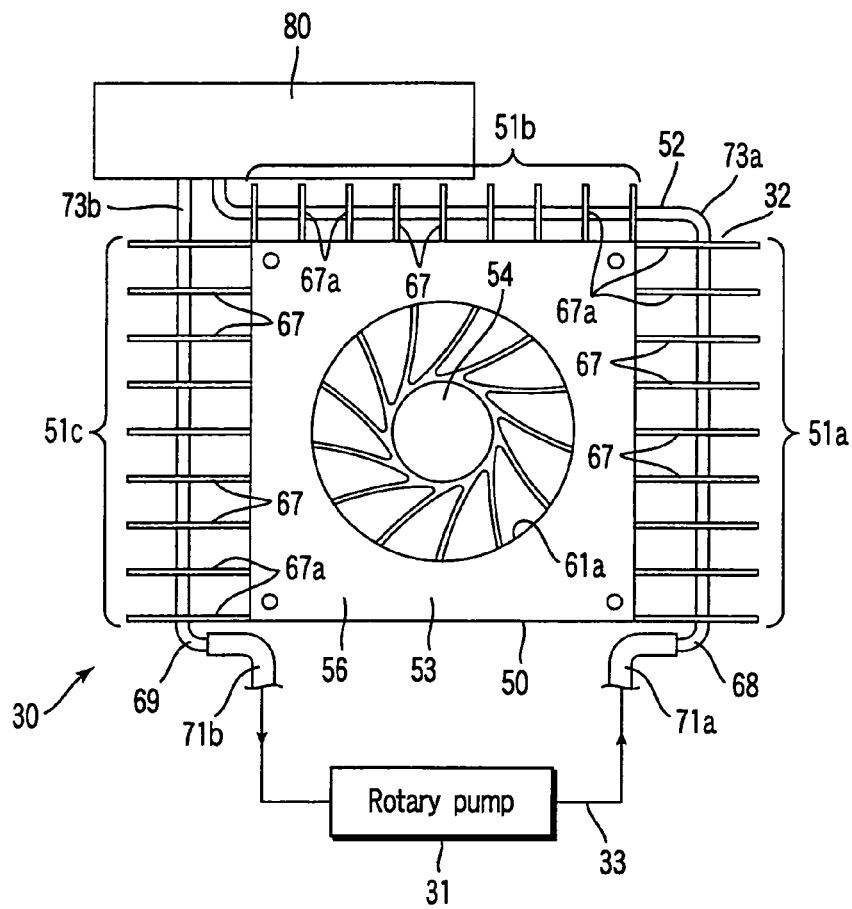
F I G. 11
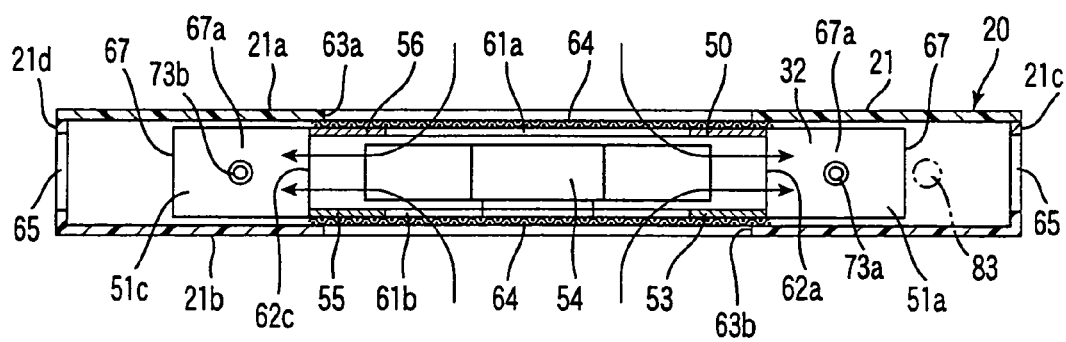
F I G. 12

Impeller rotating at constant speed

COOLING UNIT HAVING A PLURALITY OF HEAT-RADIATING FINS, AND ELECTRONIC APPARATUS WITH THE COOLING UNIT

CROSS-REFERENCE TO RELATED APPLICATIONS

This application is based upon and claims the benefit of priority from prior Japanese Patent Application No. 2003-147806, filed May 26, 2003, the entire contents of which are incorporated herein by reference.

BACKGROUND OF THE INVENTION

1. Field of the Invention

The present invention relates to a cooling unit having a tube and a plurality of heat-radiating fins, in which the heat of the liquid coolant flowing in the tube is radiated from the fins. The invention also relates to an electronic apparatus such as a portable computer with such a cooling unit.

2. Description of the Related Art

A CPU is incorporated in, for example, notebook-type portable computers. The heat that the CPU generates while operating increases as its data-processing speed rises or as it performs more and more functions. The higher the temperature of the CPU, the less efficiently it operates. To cool the CPU, so-called "cooling system of liquid cooling type" have been put to use in recent years. The cooling system uses a liquid coolant that has a far higher thermal conductivity than air.

U.S. Pat. No. 6,510,052 B2 discloses a cooling system of liquid cooling type, designed for use in notebook-type portable computers that have a main unit and a display unit. This cooling system has a heat receiving head, a heat radiator, a circulation path for circulating liquid coolant, and an intermediate cooling unit. Once the cooling system has been incorporated into a portable computer, the heat-receiving head is provided in the main unit of the computer and thermally connected to the CPU thereof. The heat radiator is provided in the display unit of the computer and located adjacent to the display device that is provided in the display unit. The circulation path connects the heat receiving head and the heat radiator.

The intermediate cooling unit is arranged on the circulation path. The intermediate cooling unit has a main body and an electric fan. The main body has a first passage, a second passage, and a plurality of heat-radiating fins. Liquid coolant flows in the first passage after it is heated in the heat-receiving head. Cooling air supplied by the electric fan flows in the second passage. The heat-radiating fins protrude from the bottom of the second passage. The fins extend straight in the direction of the cooling airflows. The cooling air passes through the gap between any adjacent fins.

In this cooling system, the liquid coolant absorbs the heat of the CPU in the heat receiving head. The liquid coolant thus heated is supplied through the circulation path to the intermediate cooling unit. In the intermediate cooling unit, the coolant flows through the first passage. While the coolant is flowing through the first passage, part of heat propagates from the coolant to the main body. The cooling air flowing in the second passage cools the main body and takes the heat of the CPU transmitted to the main body. As a result, the liquid coolant heated in the heat receiving head is cooled by virtue of heat exchange with the cooling air, before it reaches the heat radiator.

The liquid coolant cooled in the intermediate cooling unit is supplied to the heat radiator. As the coolant passes through the heat radiator, it releases the heat of the CPU. The liquid coolant cooled in the heat radiator is supplied back to the heat receiving head via the circulation path. In the heat receiving head, the coolant absorbs heat from the CPU. As the coolant is so circulated, the heat is transferred from the CPU first to the intermediate cooling unit and then to the heat radiator.

In the conventional cooling system, the electric fan of the intermediate cooling unit can supply cooling air, but in only one direction with respect to the axis of rotation of its impeller. This restricts the shape that the second passage may have and the number of fins that can contact the cooling air. Consequently, the total area at which the fins contact the cooling air is insufficient. To make matters worse, each heat-radiating fin is connected to the bottom of the second passage, at its narrow end. Inevitably, heat propagates to each fin in a smaller amount than otherwise, from the liquid coolant flowing in the first passage.

Consequently, the surface temperature of each heat-radiating fin cannot rise as much as is desired. That is, the heat of the liquid coolant cannot be radiated with high efficiency.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is a plan view the cooling unit incorporated in the portable computer;

FIG. 12 is a plan view showing an exemplary cooling unit incorporated in the third housing;

DETAILED DESCRIPTION OF THE INVENTION

Figure 1:
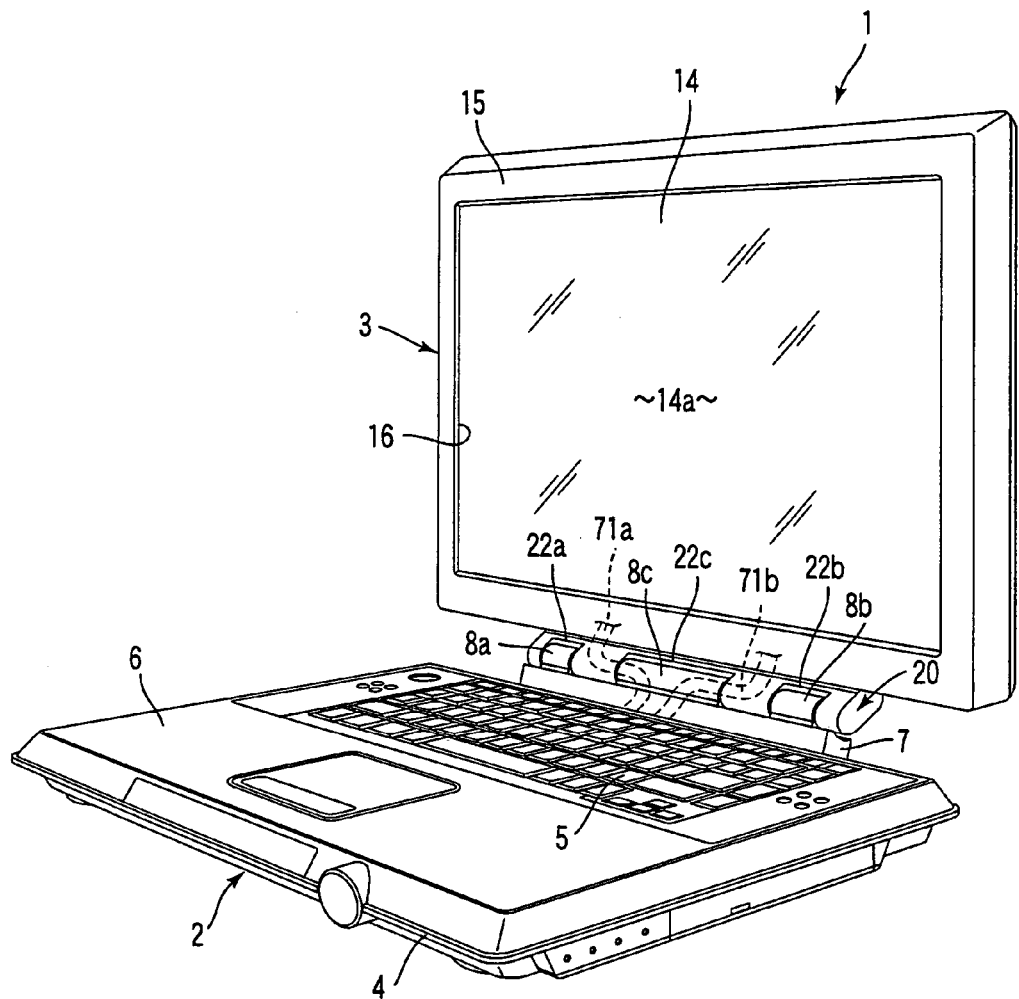
FIG. 1 is a perspective view of an exemplary portable computer according to an embodiment of this invention, showing the display unit rotated to the second position.

An embodiment of this invention will be described, with reference to FIGS. 1 to 14.

FIGS. 1–7 illustrate a portable computer 1, or an electronic apparatus according to the present invention. The portable computer 1 comprises a main unit 2 and a display unit 3. The main unit 2 has a first housing 4 that is shaped like a flat box. The first housing 4 supports a keyboard 5. The front half of the upper surface of the first housing 4 is a palm rest 6, on which the user of the computer 1 may place his or her palms while operating the keyboard 5.

The rear edge of the first housing 4 has a coupling seat 7. The coupling seat 7 extends in the widthwise direction of the first housing 4 and protrudes upwards to a level higher than the upper surface of the first housing 4 and the keyboard 5. Three hollow projections 8a, 8b and 8c are formed integral with the coupling seat 7. The first hollow projection 8a projects upwards from one end of the seat 7. The second hollow projection 8b projects upwards from the other end of the seat 7. The third hollow projection 8c projects upwards from the middle part of the seat 7 and is located between the first and second hollow projections 8a and 8b.

Figure 6:
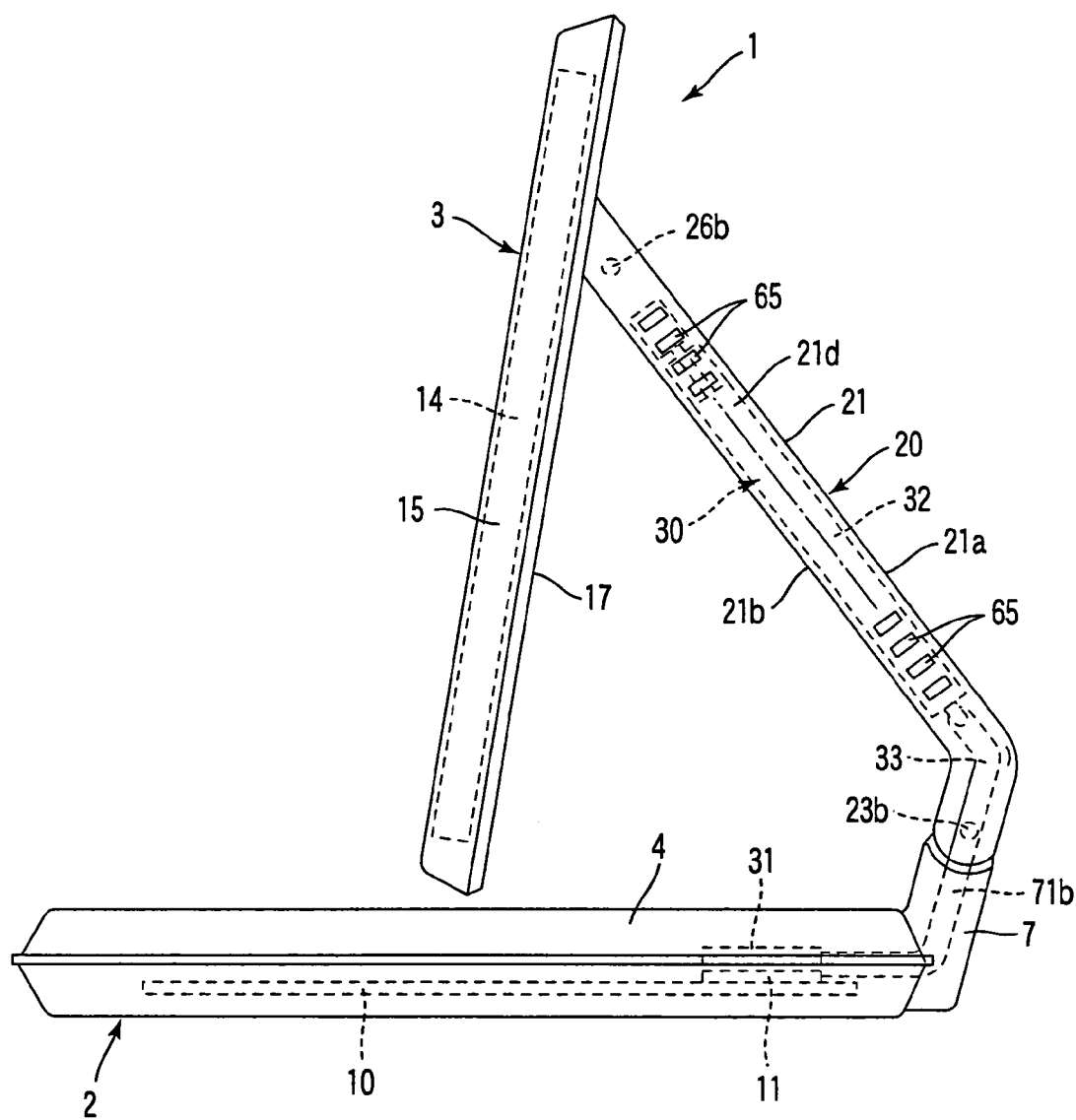
FIG. 6 is a side view of the portable computer of FIG. 1, illustrating the positional relation the display unit has with the support unit when it is moved to the third position.
Figure 8:
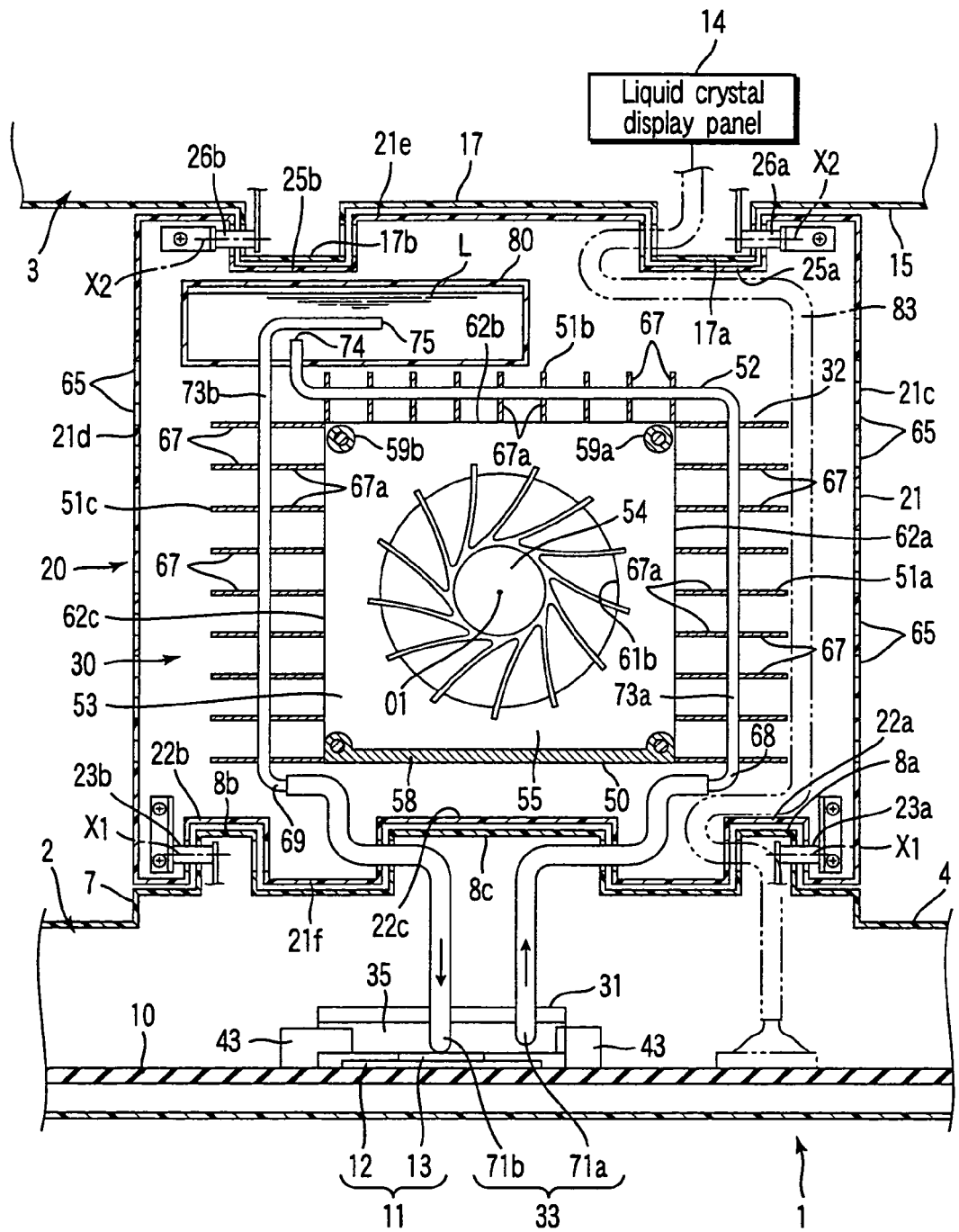
FIG. 8 is a sectional view of the portable computer, illustrating the positional relation between the heat-receiving portion provided in the main unit, the heat-radiating portion provided in the support unit and the circulation path for circulating liquid coolant between the heat-receiving and heat-radiating portions.

As illustrated in FIGS. 1, 6 and 8, the first housing 4 contains a printed circuit board 10. The printed circuit board 10 has a CPU 11 on its upper surface. The CPU 11, which is a heat-generating component deployed within a BGA-type semiconductor package for example. Located in the rear part of the first housing 4, the CPU 11 has a base substrate 12 and an IC chip 13. The IC chip 13 is mounted on the center part of the base substrate 12. In general, the amount of heat produced by the CPU 11 is correlated to its operational speed. Therefore, the IC chip 13 should be cooled to maintain operational stability.

The display unit 3 is an independent component, separated from the main unit 2. The display unit 3 comprises a display device (e.g., liquid crystal display panel) 14 and a second housing 15. The liquid crystal display panel 14, or any other type of display device, has a screen 14a that displays images. The second housing 15 is shaped like a flat box and has almost the same size as the first housing 4. The second housing 15 contains the liquid crystal display panel 14. It has a rectangular opening 16 in its front. Through the opening 16, the screen 14a of the liquid crystal display panel 14 is exposed outside the second housing 15.

Figure 2:
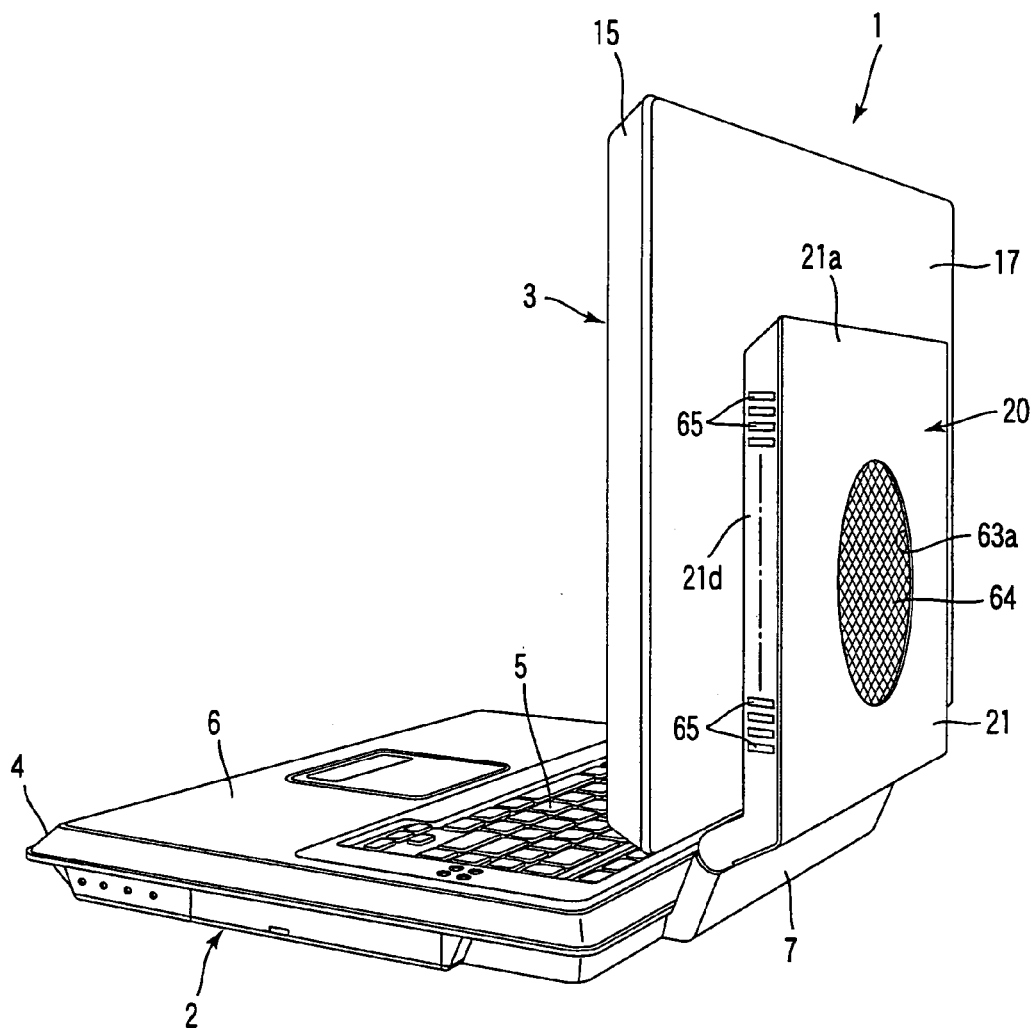
FIG. 2 is a perspective view of the portable computer of FIG. 1, depicting the positional relation the display unit has with the support unit when it is rotated to the second position.
Figure 3:
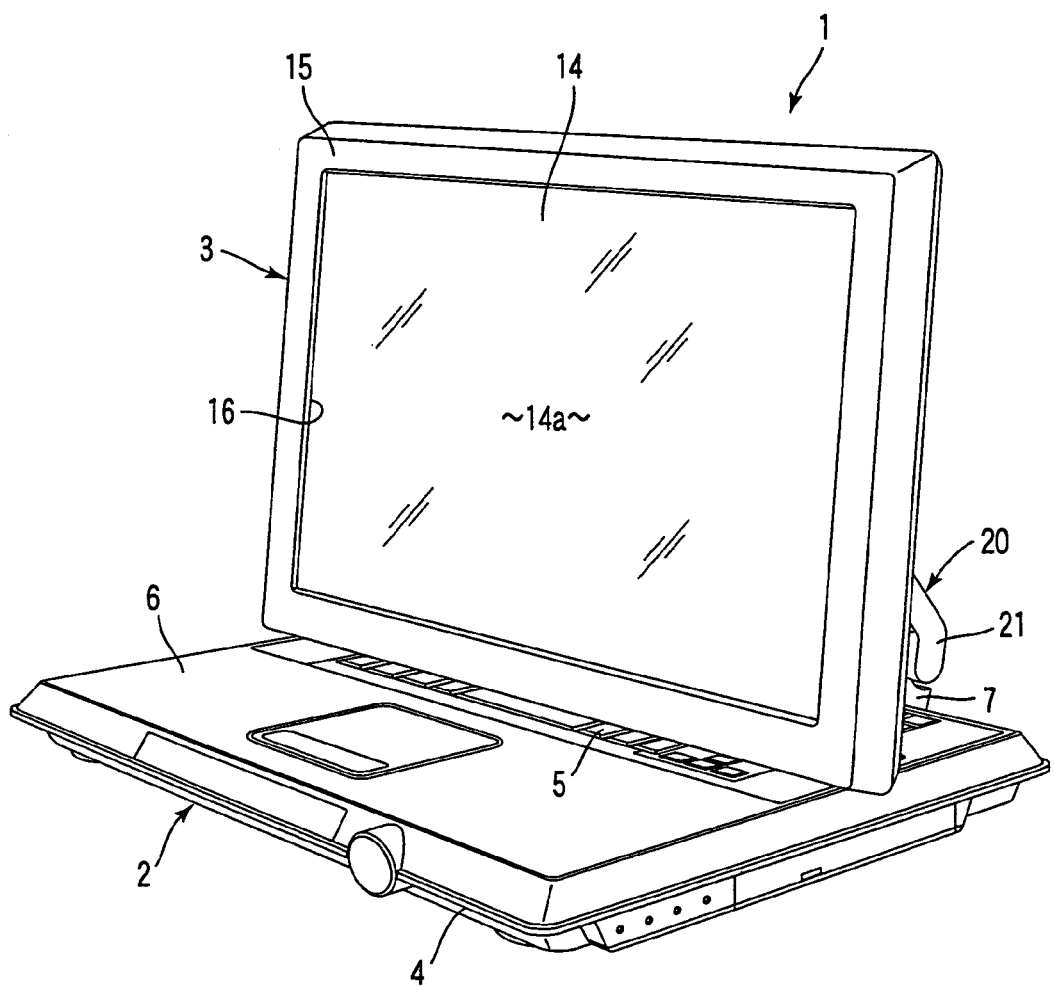
FIG. 3 is a perspective view of the portable computer of FIG. 1, showing the display unit rotated to the third position.

As FIGS. 2 and 6 depicts, the second housing 15 has a back plate 17. The back plate 17 is provided on the back of the liquid crystal display panel 14. As FIG. 8 shows, the back plate 17 has a pair of hollow parts 17a and 17b. Both hollow parts 17a and 17b lie at a level higher than the midpoint of the second housing 15. They are spaced apart in the widthwise direction of the second housing 15 and project toward the back of the second housing 15.

As is illustrated in FIGS. 4 to 8, the portable computer 1 has a support unit 20. The support unit 20 has a third housing 21. The third housing 21 is shaped like a flat box, comprising a top wall 21a, a bottom wall 21b, left and right side walls 21c and 21d, and a pair of end walls 21e and 21f. The top wall 21a and the bottom wall 21b are opposite of each other. The side walls 21c and 21d and the end walls 21e and 21f connect the four edges of the top wall 21a to the corresponding edges of the bottom wall 21b. The third housing 21 has a smaller width than the first and second housings 4 and 15.

Figure 7:
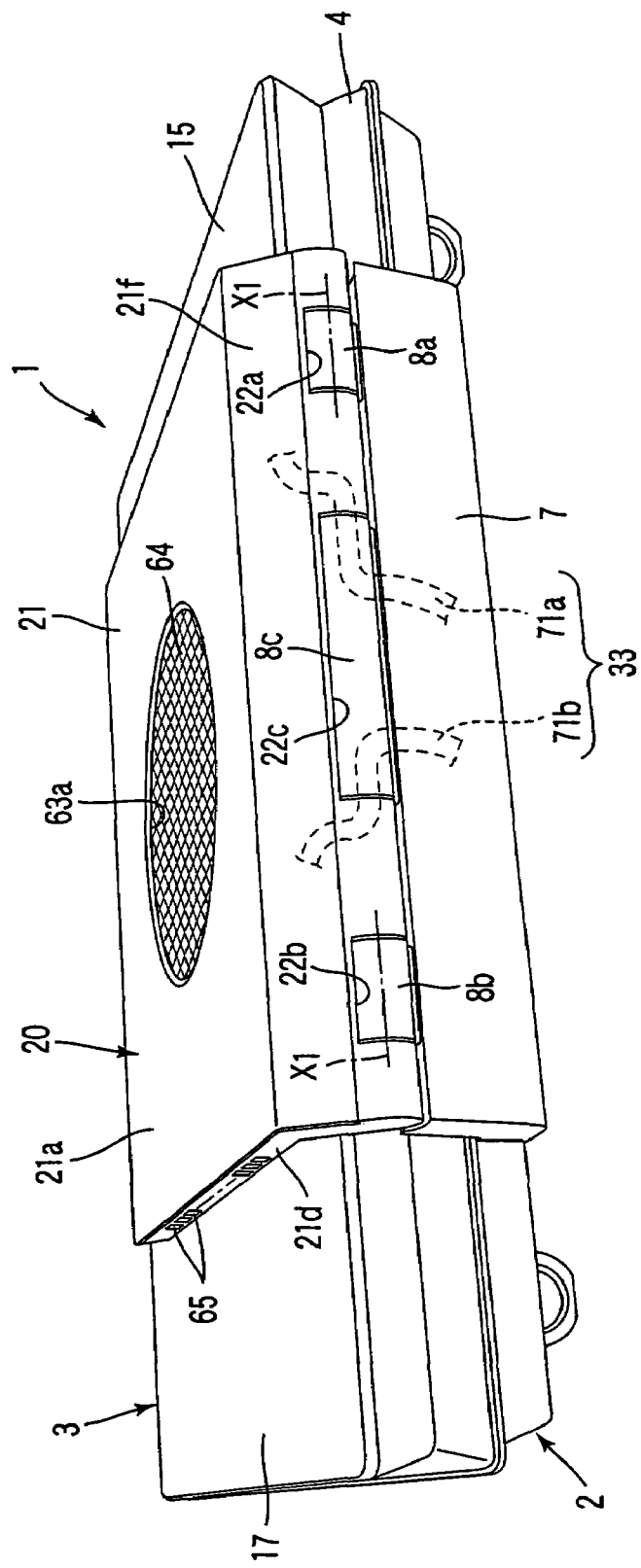
FIG. 7 is a perspective view of the portable computer of FIG. 1, showing the display unit rotated to the first position.

As seen from FIGS. 7 and 8, one horizontal edge of the third housing 21 has three recesses 22a, 22b and 22c. The first and second recesses 22a and 22b are spaced apart in the widthwise direction of the third housing 21 and aligned with the first and second hollow projections 8a and 8b, respectively. The first and second hollow projections 8a and 8b protrude into the first and second recesses 22a and 22b. The third recess 22c lies between the first and second recesses 22a and 22b, aligned with the third hollow projection 8c. The third hollow projection 8c protrudes into the third recess 22c.

A pair of first hinges 23a and 23b couple the horizontal edge of the third housing 21 to the coupling seat 7 of the first housing 4. One of the first hinges, 23a, extends between the first hollow projection 8a of the seat 7 and the third housing 21. The other first hinge 23b extends between the second hollow projection 8b of the seat 7 and the third housing 21. The first hinges 23a and 23b have a common horizontal axis X1 that extends in the widthwise direction of the first housing 4. The horizontal edge of the third housing 21 can rotate around the axis X1 with respect to the coupling seat 7 of the first housing 4.

As FIG. 8 shows, the other horizontal edge of the third housing 21 has two recesses 25a and 25b. These recesses 25a and 25b are spaced in the widthwise direction of the third housing 21 and aligned with the hollow projections 17a and 17b of the second housing 15. The hollow projections 17a and 17b protrude into the recesses 25a and 25b.

A pair of second hinges 26a and 26b couple the other horizontal edge of the third housing 21 to the back plate 17 of the second housing 15. One of the second hinges, 26a, extends between the hollow projection 17a of the second housing 15 and the third housing 21. The other second hinge 26b extends between the hollow projection 17b of the second housing 15 and the third housing 21. The second hinges 26a and 26b have a common horizontal axis X2 that extends in the widthwise direction of the third housing 21. The other horizontal edge of the third housing 21 can rotate around the axis X2 with respect to the back plate 17 of the second housing 15.

That is, the third housing 21 can rotate between a position where it overlaps the back plate 17 of the second housing 15 and a position where it is remote from the back plate 17. The third housing 21 can be held at these positions, owing to the braking forces of the second hinges 26a and 26b.

Thus, the support unit 20 couples the display unit 3 to the main unit 20 allowing the display unit 3 to rotate independently of the support unit 20. More specifically, the display unit 3 can rotate between the first and second positions, while overlapping the support unit 20. FIG. 7 shows the display unit 3 rotated to the first position. As seen from FIG. 7, the display unit 3 lies on the main unit 2, covering the keyboard 5 and palm rest 6 from above, as long as it remains at the first position. FIG. 1 shows the display unit 3 rotated to the second position. At the second position, the display unit 3 stands upright at the rear edge of the main unit 2, exposing the keyboard 5, palm rest 6 and screen 14a.

The user of the computer 1 may rotate the display unit 3 upwards to any position between the first and second position. In this case, the back plate 17 of the second housing 15 moves away from the support unit 20. As a result, the display unit 3 moves to a third position as is illustrated in FIG. 6. At the third position, the display unit 3 stands up, more forwards a little than at the second position. Thus, the display unit 3 can be moved in a generally lateral direction over the main unit 2 by changing the angle at which the support unit 20 stands. The support unit generally remains in a raised orientation at the back of the display unit 3 when in the second or third positions. Once the display unit 3 has reached the third position, the housing of the support unit 20, i.e., third housing 21, gradually inclines upwards as it moves forward from the rear edge of the first housing 4.

Figure 4:
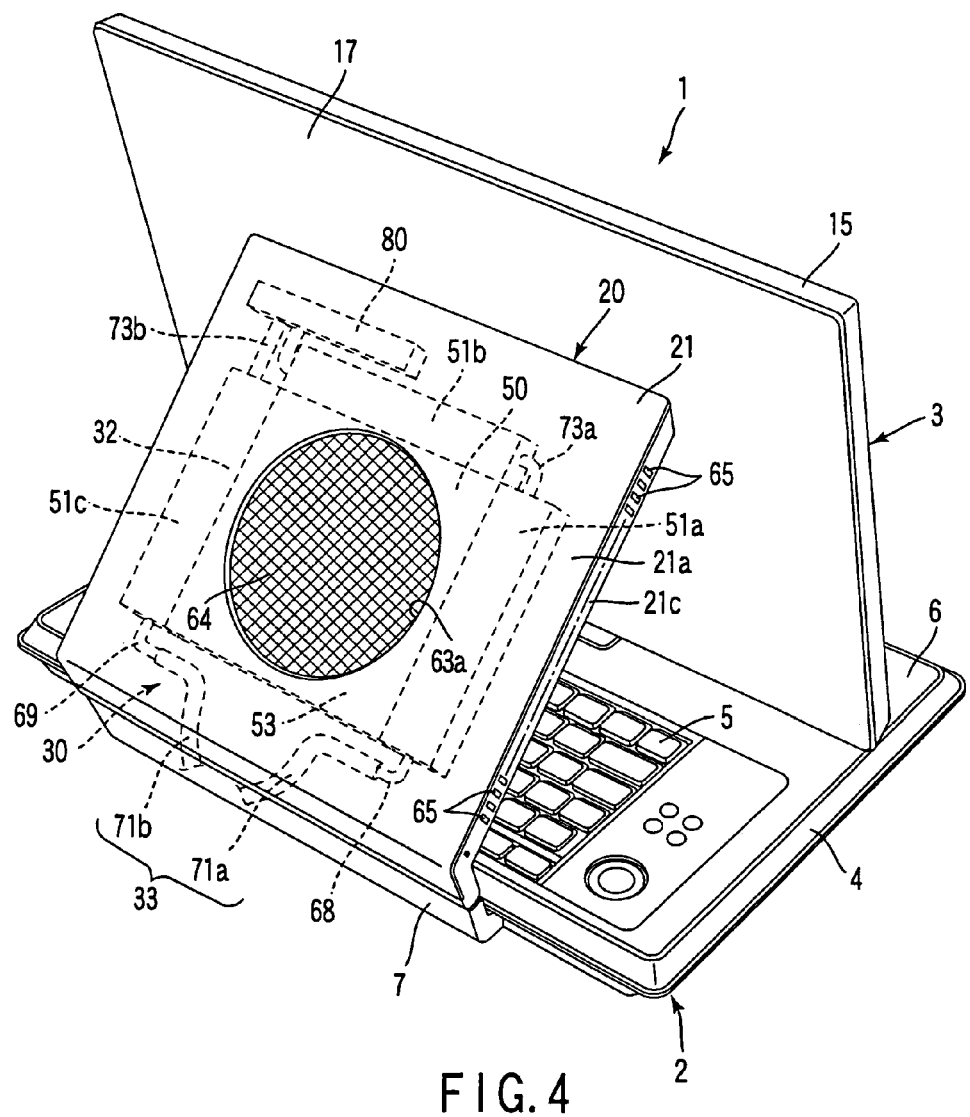
FIG. 4 is a perspective view of the portable computer of FIG. 1, depicting the positional relation the display unit has with the support unit while it is rotated to the third position.
Figure 5:
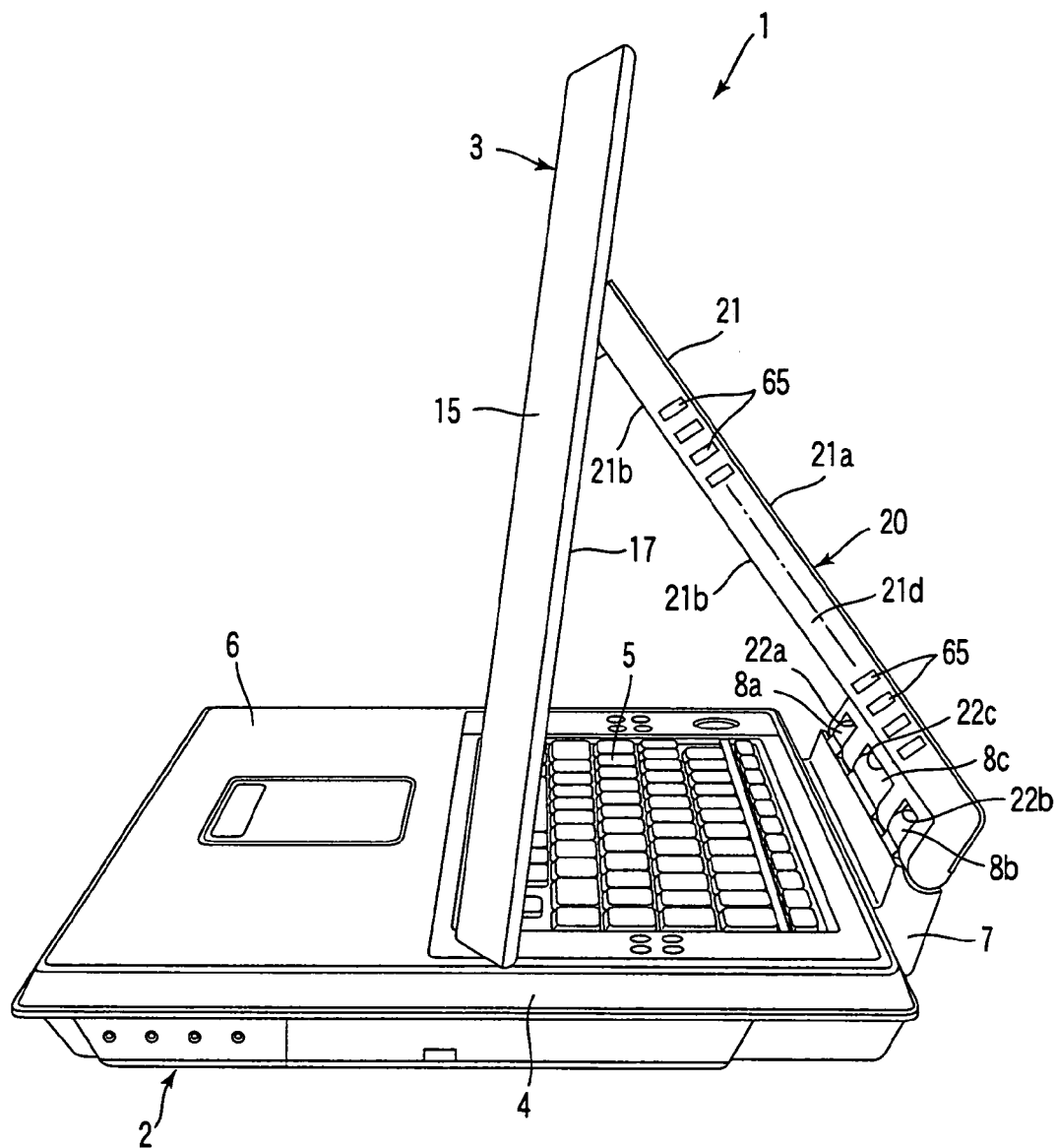
FIG. 5 is a perspective view of the portable computer of FIG. 1, representing the positional relation the display unit has with the support unit when it is moved to the third position.

As is depicted in FIGS. 4 and 8, the portable computer 1 incorporates a cooling unit 30 that is designed to cool the CPU 11 with liquid coolant. The cooling unit 30 comprises a rotary pump 31, a heat-radiating portion 32, and a circulation path 33.

Figure 10:
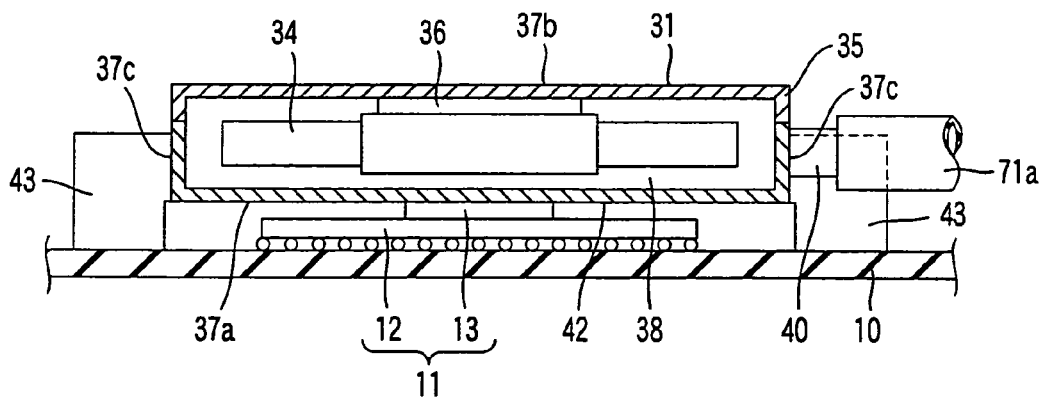
FIG. 10 is a sectional view representing the positional relation that the rotary pump and the CPU have in the portable computer.

The rotary pump 31 functions as heat-receiving portion as well, to receiving the heat that the CPU 11 generates while operating. The pump 31 is provided in the first housing 4 and mounted on the upper surface of the printed circuit board 10. As FIG. 10 shows, the rotary pump 31 comprises an impeller 34, a pump housing 35 and a flat motor 36. The flat motor 36 starts driving the impeller 34 when the power switch on the portable computer 1 is turned on or when the temperature of the CPU 11 rises to a preset thermal threshold value.

The pump housing 35 contains the impeller 34. The pump housing 35 is shaped like a flat box and larger than the CPU 11. It is made of material excelling in thermal conductivity, such as aluminum alloy. The pump housing 35 has a bottom wall 37a, a top wall 37b, and four side walls 37c. The walls 37a, 37b and 37c define a pump chamber 38, in which the impeller 34 is located. The lower surface of the bottom wall 37a of the pump housing 35 is flat, serving as heat-receiving surface 42. The heat-receiving surface 42 is large, covering the CPU 11 from above.

Figure 9:
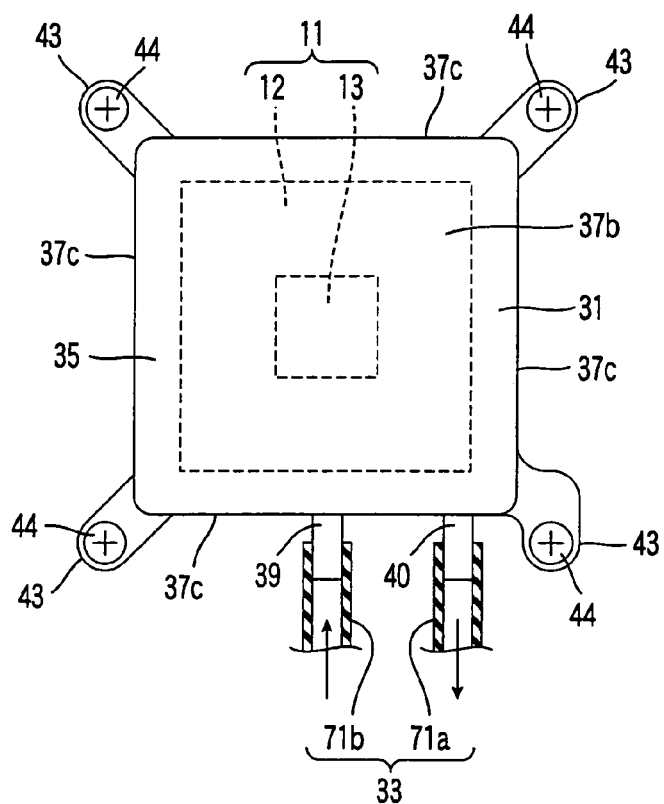
FIG. 9 is a plan view of an exemplary rotary pump incorporated in the portable computer.

As illustrated in FIG. 9, the pump housing 35 has an inlet port 39 and an outlet port 40. The ports 39 and 40 open to the pump chamber 38 and protrude from one of the side walls 37c toward the back of the first housing 4.

The pump housing 35 has four legs 43. The legs 43 are provided at the four corners of the pump housing 34 and project downwards from the heat-receiving surface 42. Screws 44 fasten the legs 43 to the upper surface of the printed circuit board 10. Since the legs 43 are so fastened to the board 10, the pump housing 35 overlaps the CPU 11 and the center part of the heat-receiving surface 42 is thermally coupled to the IC chip 13 of the CPU 11.

The third housing 21 of the support unit 20 contains the heat-radiating portion 32 of the cooling unit 30. As FIGS. 8, 11 and 12 shows, the heat-radiating portion 32 comprises an electric fan 50, first to third fin assemblies 51a, 51b and 51c, and a tube 52.

The electric fan 50 has a fan case 53 and a centrifugal impeller 54. The fan case 53 is made of material with a high thermal conductivity constant, such as aluminum alloy. The fan case 53 comprises a rectangular main part 55 and a cover 56. The main part 55 has a side wall 58 and a pair of bosses 59a and 59b. The side wall 58 rises from one edge of the main part 55. The bosses 59a and 59b are provided at the opposite edge of the main part 55. The cover 56 is secured to the side wall 58 and bosses 59a and 59b and extends between the top of the side wall 58 and the tops of bosses 59a and 59b.

The main part 55 supports the impeller 54, which is interposed between the main part 55 and the cover 56. A flat motor (not shown) starts driving the impeller 54 when the power switch on the portable computer 1 is turned on or when the temperature of the CPU 11 rises to a preset thermal threshold value.

The fan case 53 has two suction ports 61a and 61b and first to third discharge ports 62a, 62b and 62c. The suction ports 61a and 61b are made, each in the cover 56 and the main part 55. They oppose each other, across the impeller 54.

As seen from FIG. 8, the first discharge port 62a lies between one boss 59a, on the one hand, and the side wall 58 of the main part 55, on the other. The second discharge port 62b lies between the bosses 59a and 59b. The third discharge port 62c lies between the one boss 59b, on the one hand, and side wall 58 of the main part 55, on the other. Stated in another way, the first discharge port 62a and the third discharge port 62c are positioned on opposite sides of the impeller 54, and the second discharge port 62b faces the side wall 58 across the impeller 54.

Made in three sides of the fan case 53, the first to third discharge ports 62a, 62b and 62c surround the periphery of the impeller 54. Hence, the discharge ports 62a, 62b and 62c opens in three directions, each extending in three lines that meet at the axis 01 of rotation of the impeller 54. Thus, the ports 62a, 62b and 62c define an elongate opening that extends around the axis 01 through a larger angle of rotation than in the conventional cooling systems.

When the impeller 54 is driven, air flows into the fan case 53 through the suction ports 61a and 61b. In the fan case 53, the air flows to the center part of the impeller 54 and further flows from the periphery of the impeller 54. Finally, the air is expelled from the fan case 53 through the first to third discharge ports 62a, 62b and 62c. Therefore, the cooling air is applied in three directions from the fan case 53 of the electric fan 50.

Figure 13:
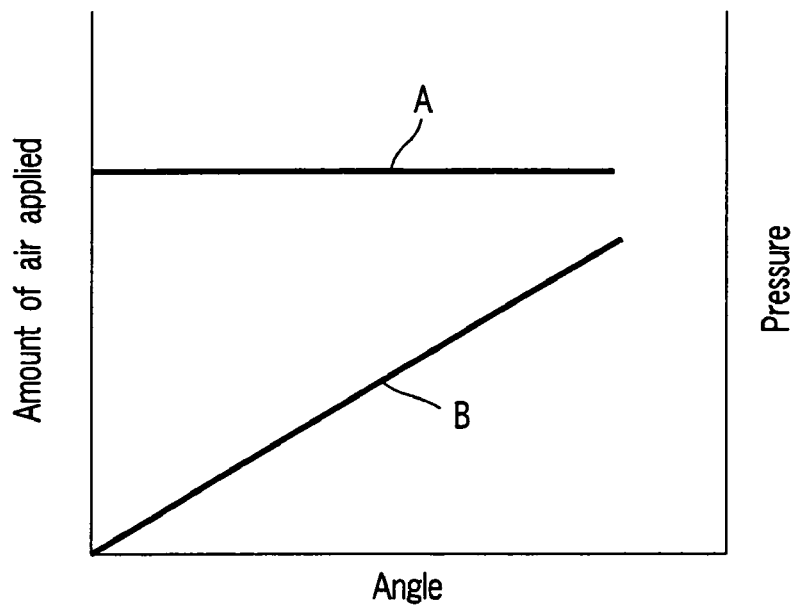
FIG. 13 is a graph showing a relation between the size of the opening of a discharge port and the amount and pressure in and at which cooling air is applied through discharge port, said opening extending around the axis of rotation of an impeller.

FIG. 13 illustrates a relation between the size of the opening of a discharge port and the amount and pressure in and at which cooling air is applied through discharge port, said opening extending around the axis of rotation of an impeller. As line A shows, the pressure at which the cooling air is applied through the discharge port remains unchanged, regardless of the size of the opening of the port. As line B indicates, the amount in which the cooling air is applied through the discharge port increases in proportion to the size of the opening of the port.

As specified above and shown in FIG. 8, the electric fan 50 has three discharge ports 62a, 62b and 62c, which are made in the three sides of the fan case 53. Hence, the fan 50 can apply cooling air through the ports 62a, 62b and 62c in a sufficient amount. For instance, cooling air may be applied in a sufficient amount and at a sufficient pressure when the ports 62a to 62c define an elongate opening extending around the axis 01 of rotation of the impeller 54 through an angle equal to or greater than 190°.

As shown in FIGS. 8 and 12, screws fasten the fan case 53 of the electric fan 50 to the bottom wall 21b of the third housing 21. The top wall 21a and bottom wall 21b of the third housing 21 have intake ports 63a and 63b, respectively. The intake ports 63a and 63b oppose the suction ports 61a and 61b of the fan case 53 and have a larger opening than the suction ports 61a and 61b. Two mesh guards 64 cover the intake ports 63a and 63b, respectively, to prevent foreign matter, such as clips, from entering the intake ports 63a and 63b.

As illustrated in detail in FIG. 8, the first and third discharge ports 62a and 62c of the fan case 53 oppose the side walls 21c and 21d of the third housing 21, respectively. The second discharge port 62b of the fan case 53 opposes the end wall 21e of the third housing 21. The side walls 21c and 21d of the third housing 21 have a plurality of exhaust ports 65. The exhaust ports 65 are arranged in a row, each spaced apart from another, and located at the back of the display unit 3.

The first to third fin assemblies 51a, 51b and 51c are provided, respectively, in the first to third discharge ports 62a, 62b and 62c of the fan case 53. The assemblies 51a, 51b and 51c have heat-radiating fins 67 each. The fins 67 are shaped like a flat plate. The fins 67 are made of metal that excels in thermal conductivity, such as aluminum alloy. The heat-radiating fins 67 are arranged are spaced apart, extending parallel to one another. The fins 67 are secured to the rims of the first to third discharge ports 62a, 62b and 62c of the fan case 53. Each heat-radiating fin 67 has two flat heat-radiating surfaces 67a. One heat-radiating surface of 67a of each fin 67 opposes one heat-radiating surface 67a of any adjacent fin 67, defining a gap with the heat-radiating surface 67a of the adjacent fin 67.

The first to third fin assemblies 51a, 51b and 51c are arranged, surrounding the impeller 54 of the electric fan 50 at three sides of the fan case 53. The cooling air discharged through the first to third discharge ports 62a, 62b and 62c flows, passing through the gaps between the heat-radiating fins 67 of the first to third fin assemblies 51a, 51b and 51c.

The tube 52 of the heat-radiating portion 32 is made of metal that excels in thermal conductivity, such as aluminum alloy. As seen from FIGS. 8 and 11, the tube 52 passes through the center part of each heat-radiating fin 67, not through any corner thereof, and is thermally connected the heat-radiating fin 67. The tube 52 extends at right angles to the heat-radiating fins 67 and between any two adjacent fins 67. Thus, the tube 52 extends across the first to third discharge ports 62a, 62b and 62c of the electric fan 50, respectively, and surround the impeller 54 at three sides of the fan case 53.

The tube 52 has a coolant inlet port 68 and a coolant outlet port 69. The ports 68 and 69 are located near the junction between the first housing 4 and the third housing 21.

As FIGS. 8–12 depicts, the circulation path 33 of the cooling unit 30 has two connection tubes 71a and 71b. The first connection tube 71a connects the outlet port 40 of the rotary pump 31 and the coolant inlet port 68 of the heat-radiating portion 32. The first connection tube 71a first extends from the rotary pump 31 to the third hollow projection 8c of the first housing 4, then passes through the junction between the projection 8c and the third housing 21, and further extends into the coolant inlet port 68 of the heat-radiating portion 32.

The second connection tube 71b connects the inlet port 39 of the rotary pump 31 and the coolant outlet port 69 of the heat-radiating portion 32. The second connection tube 71b first extends from the rotary pump 31 to the third hollow projection 8c of the first housing 4, then passes through the junction between the projection 8c and the third housing 21, and finally extends into the coolant outlet port 69 of the heat-radiating portion 32.

The first and second connection tubes 71a and 71b are flexible, both made of rubber or synthetic resin. Therefore, they can deform to absorb the twisting of the circulation path 33, which takes place when the positional relation between the rotary pump 31 and the heat-radiating portion 32 changes as the third housing 21 is rotated.

The liquid coolant fills the pump chamber 38 of the rotary pump 31, the tube 52 of the heat-radiating portion 32, and the circulation path 33. The liquid coolant is, for example, an antifreeze liquid prepared by adding ethylene glycol solution and, if necessary, corrosion inhibitor to water. The liquid coolant absorbs heat from the IC chip 13 as it flows in the pump chamber 38 of the rotary pump 31.

As illustrated in FIGS. 8 and 11, the tube 52 of the heat-radiating portion 32 is composed of an upstream tube 73a and a downstream tube 73b. The upstream tube 73a comprises the coolant inlet port 68 at one end and an outlet port 74 at the other end. The upstream tube 73a is bent in the form of L, passing through the heat-radiating fins 67 of the first fin assembly 51a and through the heat-radiating fins 67 of the second fin assembly 51b. The downstream tube 73b comprises the coolant outlet port 69 at one end and an inlet port 75 at the other end. The downstream tube 73b extends substantially straight, passing through the heat-radiating fins 67 of the third fin assembly 51c.

A reserve tank 80 is provided between the upstream tube 73a and the downstream tube 73b, to temporarily contain the liquid coolant. The reserve tank 80 is incorporated in the third housing 21 and located between the second fin assembly 51b of the heat-radiating portion 32 and the end wall 21f of the third housing 21. According to one embodiment, the tank 80 is rectangular shaped like a flat box, generally extending in the widthwise direction of the third housing 21. The reserve tank 80 is secured to the bottom wall 21b of the third housing 21 or the heat-radiating portion 32.

Figure 14:
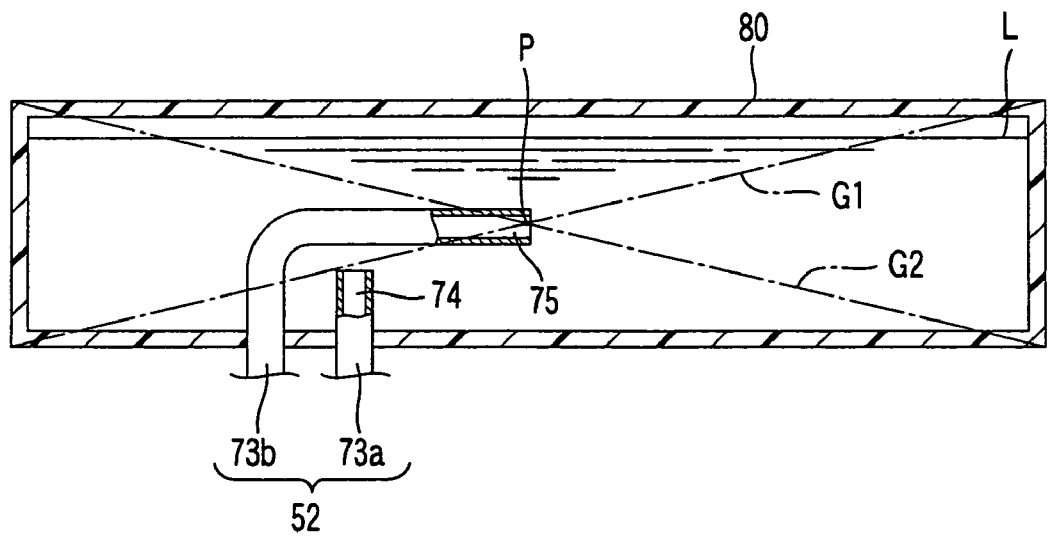
FIG. 14 is a sectional view of the reserve tank provided in the portable computer according to the embodiment of this invention.

The outlet port 74 of the upstream tube 73a and the inlet port 75 of the downstream tube 73b open to the interior of the reserve tank 80. Thus, the liquid coolant contained in the reserve tank 80 can flow into the inlet port 75 of the downstream tube 73b. The inlet port 75 of the downstream tube 73b is positioned at the center part of the reserve tank 80. Hence, as shown in FIG. 14, the inlet port 75 of the downstream tube 73b is located near the intersection P of two diagonals G1 and G2, each connecting the opposite corners of the tank 80. The inlet port 75 therefore lies below the surface level L of the liquid coolant stored in the reserve tank 80 and remains immersed in the liquid coolant.

As FIG. 8 shows, the liquid crystal display panel 14 provided in the second housing 15 is electrically connected by a cable 83 to the printed circuit board 10 incorporated in the first housing 4. The cable 83 extends from the liquid crystal display panel 14, passes through the junction between the hollow projection 17a of the second housing 15 and the recess 25a of the third housing 21, and extends into the third housing 21. In the third housing 21, the cable 83 passes between the first fin assembly 51a and side wall 21c and extends into the first housing 4 through the junction between the first recess 22a of the third housing 21 and the first hollow projection 8a of the first housing 4.

In summary, as shown in FIGS. 8–12, IC chip 13 of the CPU 11 generates heat while the portable computer 1 is being used. The heat that the IC chip 13 generates is transmitted to the pump housing 35 because the IC chip 13 is thermally connected to the heat-receiving surface 42 of the pump housing 35. The pump housing 35 has the pump chamber 38, which is filled with the liquid coolant. The liquid coolant absorbs most of the heat provided to the pump housing 35 from the IC chip 13.

When the impeller 34 of the rotary pump 31 rotates, the liquid coolant is forced from the pump chamber 38 through the outlet port 40. The coolant flows into the heat-radiating portion 32 through the first connection tube 71a. Thus, the liquid coolant circulates between the pump chamber 38 and the heat-radiating portion 32.

More specifically, the liquid coolant heated by virtue of the heat exchange in the pump chamber 38 is supplied to the upstream tube 73a of the heat-radiating portion 32. The liquid coolant flows through the upstream tube 73a. The coolant heated further flows from the outlet port 74 of the upstream tube 73a into the reserve tank 80. The liquid coolant flowing through the upstream tube 73a may contain bubbles. In this case, the bubbles are removed from the coolant in the reserve tank 80. The liquid coolant that is temporarily stored in the reserve tank 80 is drawn into the inlet port 75 of the downstream tube 73b. The liquid coolant then flows from the downstream tube 73b into the second connection tube 71b.

The upstream tube 73a and downstream tube 73b, in which the liquid coolant flows, are thermally connected to the heat-radiating fins 67 of the first to third fin assemblies 51a, 51b and 51c. The heat of the IC chip 13, absorbed in the liquid coolant, is therefore transmitted to the heat-radiating fins 67 as the liquid coolant flows through the upstream tube 73a and downstream tube 73b.

The first to third fin assemblies 51a, 51b and 51c are located at the three discharge ports 62a, 62b and 62c of the electric fan 50, respectively, and surround the impeller 54 at three sides of the fan case 53. When the impeller 54 rotates, the cooling air discharged via the discharge ports 62a, 62b and 62c passes between the heat-radiating fins 67. The cooling air is then applied to the tubes 73a and 73b. As a result, the cooling air takes away the heat transmitted from the IC chip 13 to the heat-radiating fins 67 and the tubes 73a and 73b.

The liquid coolant is cooled because of the heat exchange performed in the heat-radiating portion 32. The coolant thus cooled flows back into the pump chamber 38 of the rotary pump 31 through the second connection tube 71b. The coolant repeats absorption of the heat of the IC chip 13. It is then supplied to the heat-radiating portion 32. Thus, the liquid coolant transfers the heat of the IC chip 13 to the heat-radiating portion 32. The heat is released outside the portable computer 1, from the heat-radiating portion 32.

In the portable computer 1, the electric fan 50 has first to third discharge ports 62a, 62b and 62c at three sides of the fan case 53, to expel the cooling air. The heat-radiating fins 67 are arranged at the discharge ports 62a, 62b and 62c. Namely, the heat-radiating fins 67 surround the impeller 54 of the electric fan 50. Thus, a large number of heat-radiating fins 57 are arranged around the impeller 54.

As a result, the total surface area of the fins 67 is so large that an efficient heat exchange can be accomplished between the fins 67 and the cooling air.

In addition, heat propagates from the liquid coolant to each fin 67 from the entire circumferential surface of the tube 52, because the tube 52 passes through the center part of the fin 67. This raises the surface temperature of each fin 67.

The liquid coolant flowing in the tube 52 can therefore be cooled with high efficiency, ultimately cooling the CPU 11 well.

The present invention is not limited to the embodiment described above. Various changes and modifications can be made, without departing from the scope and spirit of the invention. For example, the fan case may have only one suction port, not two suction ports as in the embodiment. Further, the ports for discharging the cooling air may be provided at the four or more sides of the of the fan case, not three sides thereof as in the embodiment.

Moreover, the heat-radiating portion can be provided in the first or second housing of the support unit, not in the third housing as in the embodiment described above, if the second housing is rotatably coupled to the first housing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cooling unit for cooling a heat-generating component, comprising:
    a fan having a centrifugal impeller which has a center part and a periphery and which draws cooling air at the center part and expels the cooling air at the periphery;
    a plurality of heat-radiating fins which are arranged in such a manner as to substantially enclose the periphery of the impeller; and
    a tube which is thermally connected to the heat-radiating fins and in which liquid coolant that has absorbed heat from the heat-generating component is made to circulate, the tube being arranged around the periphery of the impeller.

2. The cooling unit according to claim 1, wherein the fins have heat-radiating surfaces each, which intersect with the tube.

3. The cooling unit according to claim 2, wherein the tube extends through the heat-radiating surfaces of the fins.

4. The cooling unit according to claim 1, wherein the fan has a plurality of discharge ports arranged around the impeller.

5. The cooling unit according to claim 4, wherein the tube is arranged, crossing the discharge ports of the fan and surrounding the impeller.

6. The cooling unit according to claim 4, wherein the discharge ports of the fan open to different directions with respect to an axis of the impeller.

7. The cooling unit according to claim 4, wherein the fan has a fan case which contains the impeller and has the discharge ports, and the fins are secured to the fan case.

8. The cooling unit according to claim 1, further comprising:
    a heat-receiving portion which is thermally connected to the heat-generating component; and
    a circulation path which connects the heat-receiving portion to the tube and which is configured to circulate the liquid coolant between the heat-receiving portion and the tube.

9. The cooling unit according to claim 8, wherein the heat-receiving portion has a pump which supplies the liquid coolant into the tube.

10. An electronic apparatus having a heat-generating component and comprising;
    a housing which has exhaust ports;
    a fan provided in the housing and having a centrifugal impeller which has a center part and a periphery and which draws cooling air at the center part and expels the cooling air at the periphery;
    a plurality of heat-radiating fins which are arranged in such a manner as to substantially enclose the periphery of the impeller; and
    a tube which is thermally connected to the heat-radiating fins and in which liquid coolant that has absorbed heat from the heat-generating component is made to circulate, the tube being arranged around the periphery of the impeller.

11. The electronic apparatus according to claim 10, further comprising a heat-receiving portion which is thermally connected to the heat-generating component, and a circulation path which connects the heat-receiving portion to the tube and which is configured to circulate the liquid coolant between the heat-receiving portion and the tube.

12. The electronic apparatus according to claim 11, wherein the heat-receiving portion has a pump which supplies the liquid coolant into the tube.

* * * * *